(12) United States Patent
Sweegers et al.

(10) Patent No.: US 9,841,169 B2
(45) Date of Patent: Dec. 12, 2017

(54) LIGHTING DEVICE COMPRISING A ROLL

(71) Applicant: PHILIPS LIGHTING HOLDING B.V., Eindhoven (NL)

(72) Inventors: Norbertus Antonius Maria Sweegers, Lierop (NL); Marc Andre De Samber, Lommel (BE)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 166 days.

(21) Appl. No.: 14/769,710

(22) PCT Filed: Feb. 24, 2014

(86) PCT No.: PCT/IB2014/059193
§ 371 (c)(1),
(2) Date: Aug. 21, 2015

(87) PCT Pub. No.: WO2014/128667
PCT Pub. Date: Aug. 28, 2014

(65) Prior Publication Data
US 2016/0003459 A1    Jan. 7, 2016

Related U.S. Application Data

(60) Provisional application No. 61/768,638, filed on Feb. 25, 2013.

(51) Int. Cl.
*F21V 21/14*    (2006.01)
*F21V 29/58*    (2015.01)
(Continued)

(52) U.S. Cl.
CPC .............. *F21V 21/14* (2013.01); *C02F 1/325* (2013.01); *F21K 9/90* (2013.01); *F21V 29/58* (2015.01);
(Continued)

(58) Field of Classification Search
None
See application file for complete search history.

(56) References Cited

U.S. PATENT DOCUMENTS 6,290,713 B1    9/2001    Russell
7,270,748 B1 *  9/2007    Lieggi ................... C02F 1/325
                                                          210/198.1
(Continued)

FOREIGN PATENT DOCUMENTS

JP    2007115550 A    5/2007
WO    2011100195 A1    8/2011
(Continued)

*Primary Examiner* — Britt D Hanley
(74) *Attorney, Agent, or Firm* — Akarsh P. Belagodu

(57) ABSTRACT

A lighting device (30) and a method of manufacturing such a lighting device are provided. The lighting device comprises a sheet assembly (7), which comprises a substrate (1) being at least partly light transmissive, a plurality of light sources (5) coupled to the substrate. At least a portion of the sheet assembly (7) is fixed in a rolled-up arrangement so as to form a roll (12), whereby the light sources (5) in the portion of the sheet assembly (7) are arranged to emit light at least partly inwards in the roll and/or at least partly towards at least one end (31) of the roll. The present invention is advantageous in that it provides enhanced lumen density output, which makes the lighting device useful for high brightness applications, such as head lights and fluid purification.

13 Claims, 5 Drawing Sheets

(51) Int. Cl.
  *C02F 1/32* (2006.01)
  *F21K 9/90* (2016.01)
  *H05K 1/02* (2006.01)
  *F21Y 115/10* (2016.01)
  *F21Y 107/00* (2016.01)
  *F21Y 113/13* (2016.01)

(52) U.S. Cl.
  CPC .......... *H05K 1/028* (2013.01); *F21Y 2107/00* (2016.08); *F21Y 2113/13* (2016.08); *F21Y 2115/10* (2016.08); *H05K 1/0203* (2013.01); *H05K 1/0272* (2013.01); *H05K 2201/051* (2013.01); *H05K 2201/064* (2013.01); *H05K 2201/10106* (2013.01)

(56) References Cited

U.S. PATENT DOCUMENTS

| | | | |
|---|---|---|---|
| 7,427,782 B2 | 9/2008 | Daniels et al. | |
| 8,324,595 B2 * | 12/2012 | Takahashi | A01K 63/04 210/748.11 |
| 8,975,596 B1 * | 3/2015 | Matthews | C02F 1/325 250/432 R |
| 2009/0094734 A1 | 4/2009 | Diebel et al. | |
| 2009/0147504 A1 | 6/2009 | Teeters | |
| 2010/0176067 A1 | 7/2010 | Boyd et al. | |
| 2011/0058372 A1 | 3/2011 | Lerman et al. | |
| 2011/0109235 A1 | 5/2011 | Link | |
| 2012/0068622 A1 | 3/2012 | Ward | |
| 2013/0146783 A1 * | 6/2013 | Boodaghians | C02F 1/325 250/435 |

FOREIGN PATENT DOCUMENTS

| | | |
|---|---|---|
| WO | 2012062701 A1 | 5/2012 |
| WO | 2012138384 A1 | 10/2012 |
| WO | 2012148384 A1 | 11/2012 |

* cited by examiner

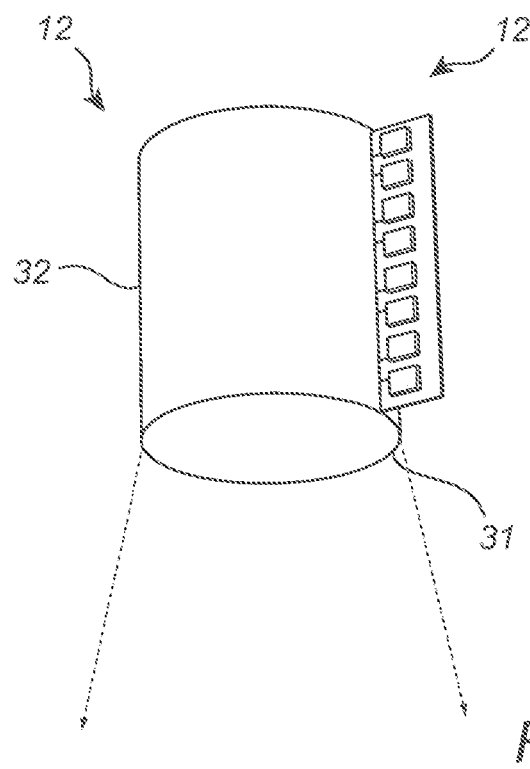
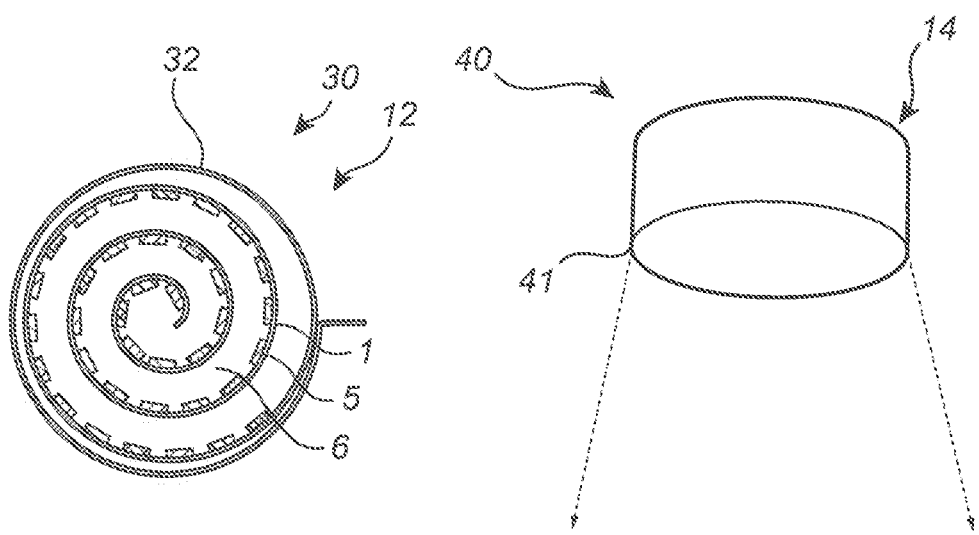

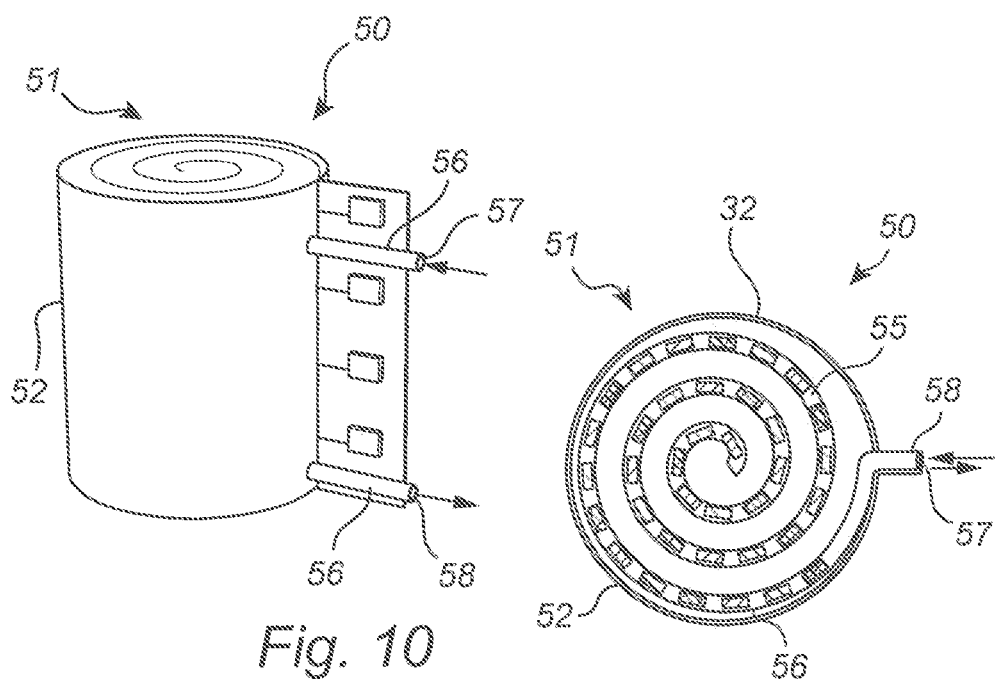
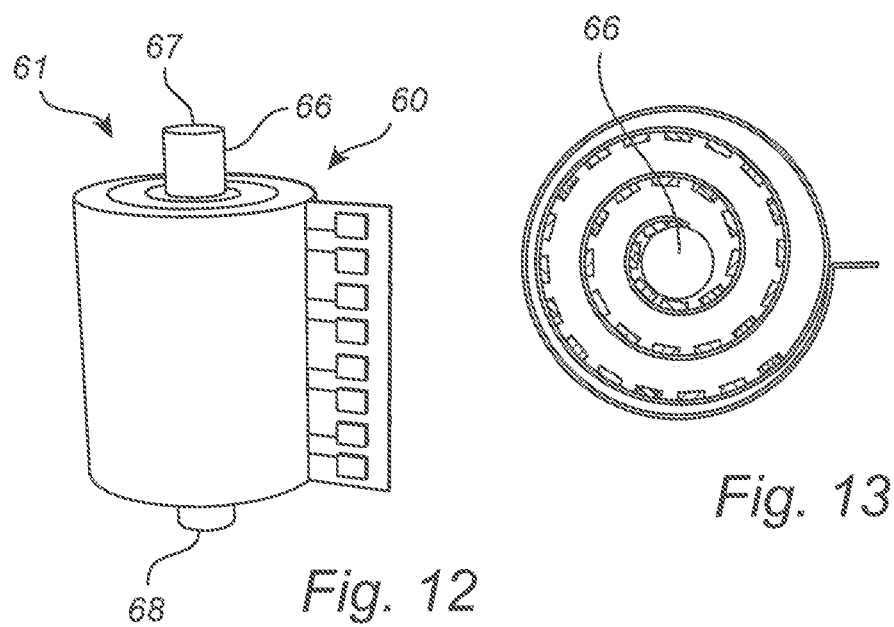

LIGHTING DEVICE COMPRISING A ROLL

CROSS-REFERENCE TO PRIOR APPLICATIONS

This application is the U.S. National Phase application under 35 U.S.C. §371 of International Application No. PCT/IB14/059193, filed on Feb. 24, 2014, which claims the benefit of U.S. Provisional Patent Application No. 61/768,638, filed on Feb. 25, 2013. These applications are hereby incorporated by reference herein.

FIELD OF THE INVENTION

The present invention generally relates to the field of lighting devices, for example for relatively high brightness application.

BACKGROUND OF THE INVENTION

High brightness lighting devices (e.g. lighting devices able to output relatively high lumen density) are used in various applications, such as in automotive head lights and for fluid (such as liquid or gas) purification. Traditional high brightness lighting devices based on incandescent and gas-discharge technologies are currently being replaced by more energy efficient solid state based alternatives, such as light emitting diode (LED) based lighting devices. US 2010/0176067 shows an example of an LED based photocatalytic reactor for removing contaminants from water. It is a challenge in design of solid state based lighting devices to provide high lumen density, as the lumen output per solid state based light source is limited.

SUMMARY OF THE INVENTION

It would be advantageous to achieve a lighting device facilitating or enabling a higher lumen density output.

To better address one or more of these concerns, a lighting device and a method of manufacturing at least one lighting device having the features defined in the independent claims are provided. Preferable embodiments are defined in the dependent claims.

According to a first aspect, a lighting device comprising a sheet assembly is provided. The sheet assembly comprises a substrate being at least partly light transmissive and a plurality of light sources coupled to the substrate. At least a portion of the sheet assembly is fixed in a rolled-up arrangement so as to form a roll.

According to a second aspect, a method of manufacturing at least one lighting device is provided. The method comprises providing a sheet assembly including a substrate being at least partly light transmissive, a plurality of light sources coupled to the substrate, and arranging and fixing at least a portion of the sheet assembly in a rolled-up arrangement so as to form a roll.

The present aspects are based on a concept of arranging the sheet assembly with the light sources as a roll for facilitating or enabling higher lumen density output. With the rolled-up arrangement, the light sources are arranged in a more compact manner, thereby enabling arranging more light sources within a limited space (which may be confined by the roll). Thus, the light sources may be arranged in several layers within the roll and since the substrate is at least partly light transmissive, light emitted by the light sources may travel or propagate within the roll at least partly without being blocked by the substrate. The enhanced lumen density output makes the lighting device advantageous for high brightness applications, such as head lights and fluid (such as liquid or gas) purification. Fixing the sheet assembly in the rolled-up arrangement enables usage of the lighting device with a reduced or even eliminated risk of unwinding the roll.

In an embodiment, the light sources in the portion of the sheet assembly (which portion is arranged in the rolled-up arrangement) are arranged to emit light at least partly inwards in the roll and/or at least partly towards at least one end of the roll. Hence, during usage, the light sources are arranged (e.g. oriented) such that light travels or propagates at least partly inwards in the roll (such as in a radial direction of the roll) and/or at least partly towards at least one end of the roll (such as in an axial direction of the roll), whereby the light output of the lighting device is concentrated inwards in the roll and/or towards the end of the roll, respectively.

Alternatively, at least some of the light sources are arranged to emit light at least partly outwards form the roll (such as in a radial direction out of the roll).

In an embodiment, at least a portion of the sheet assembly is rigidly fixed in the rolled-up arrangement. Hence, said portion of the sheet assembly (which e.g. may be a portion of the substrate) may be rigid. In an embodiment, the sheet assembly may be flexible during (the manufacturing step of) arranging the sheet assembly in the rolled-up arrangement. Further, fixing the sheet assembly in the rolled-up arrangement may comprise curing at least a portion of the sheet assembly in the rolled-up arrangement, thereby making the cured portion of the sheet assembly rigid. With the present embodiments, the rigidity of the sheet assembly keeps (holds) the sheet assembly in the rolled-up arrangement. Curing at least a portion of the sheet assembly in the rolled-up arrangement reduces the need of additional means for fixing the roll in the rolled-up arrangement.

According to an embodiment, the sheet assembly further comprises a coating layer being at least partly light transmissive and arranged to cover the light sources coupled to or at the substrate. The coating layer may act as a protective layer for the light sources and/or as a spacing layer for spacing the substrate and light sources from the overlying substrate in the roll. Further, the coating layer may improve the optical out coupling of light from the light sources.

According to an embodiment, arranging and fixing the sheet assembly in the rolled-up arrangement (during manufacturing) further comprises adhering at least a portion of a side of the sheet assembly facing inwards in the roll to at least a portion of a side of the sheet assembly facing outwards in the roll. Hence, in the lighting device, at least a portion of a side of the sheet assembly facing inwards in the roll may be adhered to at least a portion of a side of the sheet assembly facing outwards in the roll. For example, at least a portion of the side of the coating layer facing away from the light sources (i.e. the side of the sheet assembly facing inwards in the roll), or the side of the substrate on which the light sources are arranged in case no coating layer is used, may be fixed by adhesive to at least a portion of the side of the substrate opposite to the side of the substrate at which the light sources are arranged (i.e. the side of the sheet assembly facing outwards in the roll). The sheet assembly (such as the coating layer and/or the substrate) may e.g. comprise a sticky surface and/or, a layer of adhesive may be applied on the sheet assembly prior to arranging the sheet assembly in the rolled-up arrangement.

Alternatively, or as a complement to the above described embodiments, the sheet assembly may be fixed in the rolled-up arrangement by wrapping means (such as a strap or the like), which may be wrapped around the roll to hold the sheet assembly in the rolled-up position.

According to an embodiment, the lighting device further comprises a reflector arranged to at least partly surround the roll and to reflect light emitted by the light sources, which may increase the light output in the desired direction (such as inwards in the roll and/or out of the output end of the roll). The reflector may have a reflective surface facing inwards in the roll. The reflector may be specular or diffuse.

According to an embodiment, the lighting device further comprises at least one channel for fluid, wherein the at least one channel is arranged at least partly within the roll. The fluid may e.g. be water or air. The fluid may be guided in the channel in order to be purified and/or for cooling purpose, as will be described further in the following.

In an embodiment, at least one of said at least one channel is arranged such that the fluid in the channel can be illuminated by the light sources. With the present embodiment, the lighting device may be used for purifying the fluid guided in the channel. For example, the light sources may be arranged to emit ultraviolet (UV) light in order to kill or destroy possible microorganisms in the fluid illuminated by the light source. Further, the lighting device may comprise a catalyst arranged in said channel in which fluid can be illuminated by the light sources. The catalyst may be adapted to enhance purification of fluid illuminated by the light sources in the channel.

According to an embodiment, at least one of said at least one channel is arranged so as to guide fluid in the lighting device for dissipating heat generated by the light sources. Hence, heat is extracted from the light sources to the fluid, which in turn may conduct the heat out of the lighting device. Further, the channel may comprise projections extending into the channel and being adapted to dissipate heat generated by the light sources. The projections may e.g. be fins arranged in the channel. The projections increase the heat dissipation area from which heat generated by the light sources dissipates into the fluid in the channel, thereby improving cooling of the lighting device.

According to an embodiment, the at least one channel is comprised in the sheet assembly. For example, the channel may be formed by a groove in the sheet assembly, such as in the coating layer and/or in the substrate. The groove may be arranged between the substrate and the coating layer and/or on either side of the sheet assembly. In the latter case, the groove (or depression) may be closed when the sheet assembly is arranged in the rolled-up arrangement.

Alternatively, or as a complement, the channel is arranged (substantially) in the center of the roll and extend along the longitudinal direction of the roll. Optionally, the channel may comprise a tube or the like extending through the roll.

According to an embodiment, the method of manufacturing the at least one lighting device further comprises dividing the roll formed by the rolled-up arrangement of the sheet assembly along a direction transverse to the longitudinal direction of the roll, into at least two parts, wherein each part constitutes a lighting device. Hence, several lighting devices may be provided from the one and the same rolled-up sheet assembly, which may facilitate manufacturing of the lighting devices.

It is noted that the invention relates to all possible combinations of features recited in the claims. Further, it will be appreciated that the various embodiments described for the lighting device are all combinable with the method as defined in accordance with the second aspect.

Further objectives of, features of, and advantages with, the present aspects will become apparent when studying the following detailed disclosure, the drawings and the appended claims. Those skilled in the art realize that different features of the present invention can be combined to create embodiments other than those described in the following.

BRIEF DESCRIPTION OF THE DRAWINGS

These and other aspects of the present invention will now be described in more detail, with reference to the appended drawings showing embodiments of the invention.

FIG. 7 shows a lighting device according to an embodiment.

FIG. 8 is a cross-section taken perpendicular to a longitudinal direction of the lighting device shown in FIG. 7.

FIG. 9 shows a lighting device according to another embodiment.

FIG. 10 shows a lighting device according to yet another embodiment.

FIG. 11 is a cross-section taken perpendicular to a longitudinal direction of the lighting device shown in FIG. 10.

FIG. 12 shows a lighting device according to yet another embodiment.

FIG. 13 is a cross-section taken perpendicular to a longitudinal direction of the lighting device shown in FIG. 12.

All the figures are schematic, not necessarily to scale, and generally only show parts which are necessary in order to elucidate the invention, wherein other parts may be omitted or merely suggested.

DETAILED DESCRIPTION

With reference to FIGS. 1 to 6, a method of manufacturing at least one lighting device according to an embodiment will be described.

Figure 1:
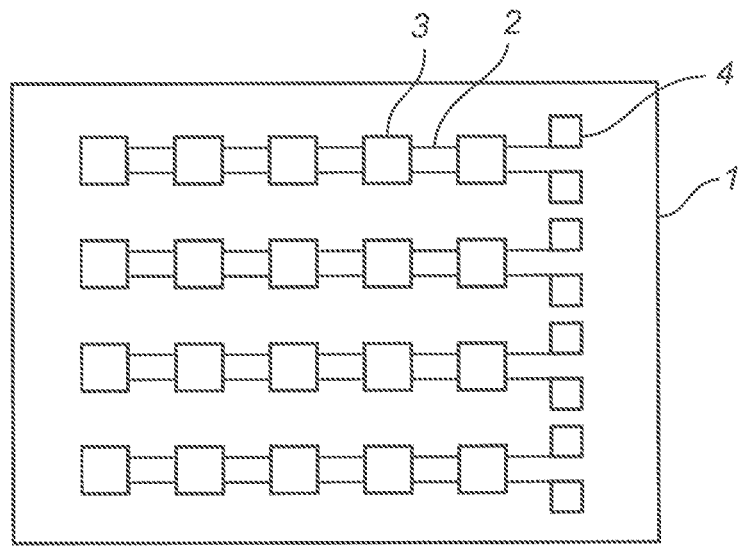
FIGS. 1 to 6 illustrate steps of a method of manufacturing a lighting device according to an embodiment.

The method comprises providing a flexible substrate 1 being at least partly light transmissive (such as transparent or translucent), as illustrated in FIG. 1. The substrate 1 may e.g. comprise polyethylene teraphthalate (PET), polyethylene naphtalate (PEN), silicone, polyurethane (PUR), epoxy, or the like material. Electronic circuitry may be coupled (directly or indirectly) to the substrate 1. The electronic circuitry may for example comprise light source contact pads 3 for connecting light sources to the electronic circuitry, driver contact pads 4 for connecting driving electronics and/or a power source to the electronic circuitry, and wiring 2 for interconnecting the light source contact pads 3 and the driver contact pads 4.

Figure 2:
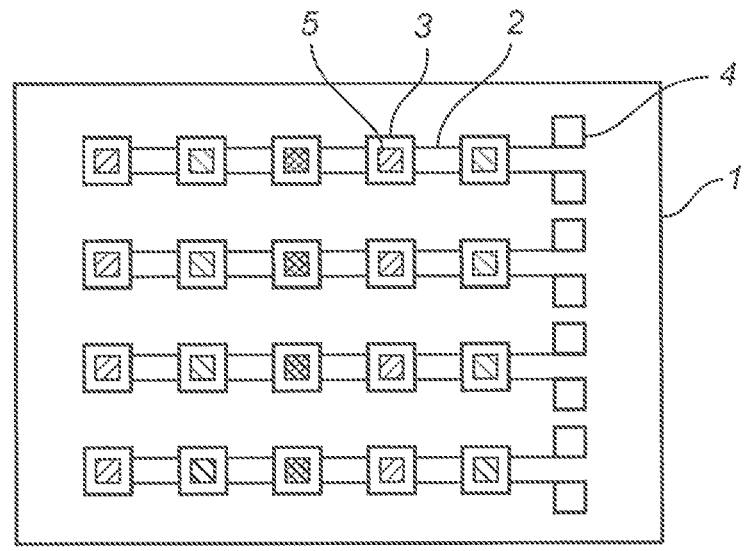

The method may further comprise coupling (or attaching) light sources 5 to the light source contact pads 3 of the electronic circuitry, as illustrated in FIG. 2. Hence, the light sources 5 may be coupled (directly or indirectly) to the substrate 1. The light sources 5 may preferably be based on solid state technology. For example, the light sources 5 may be light emitting diodes, LEDs, of one or more colors including ultraviolet, UV. Further, the light sources 5 may be arranged so as to be able to emit light of different colors (e.g. red, green and blue) to allow color mixing in the lighting device to be manufactured. Alternatively, the light sources 5 may be arranged so as to be able to emit light having substantially the same color.

Figure 3:
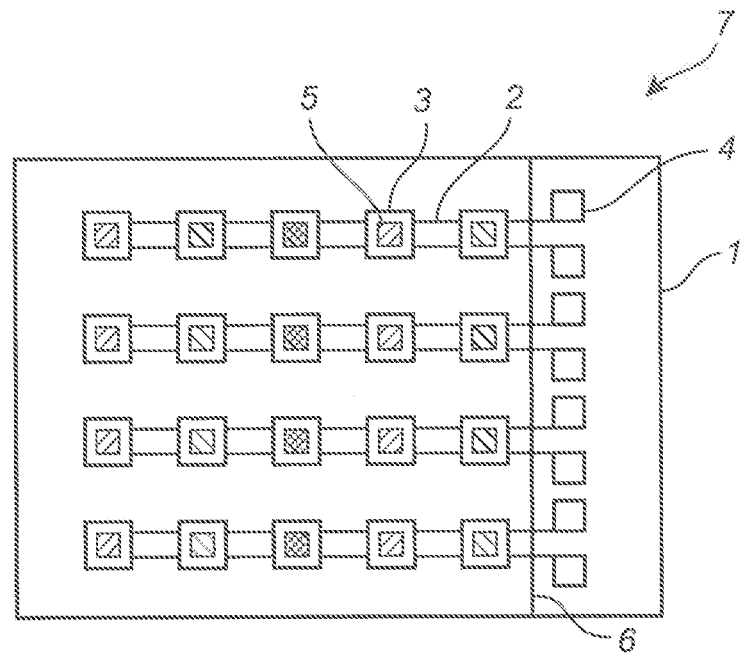

The method may further comprise arranging a flexible coating layer 6 so as to cover (at least some of) the light sources 5 at the substrate 1, as illustrated in FIG. 3. Hence, the coating layer 6 may be coupled to the substrate 1 and/or the light sources 5. The coating layer 6 may be at least partially light transmissive, such as transparent or translucent. For example, the coating layer 6 may comprise soft silicone or PUR or the like material. The assembled substrate 1, light sources 5 and coating layer 6 now form a sheet assembly 7. Preferably, at least a portion of the sheet assembly 7 may have adhesive properties, such as being at least partly sticky. For example, the material of the substrate 1 and/or the coating layer 6 may have adhesive properties. Alternatively, or as a complement, an adhesive may be applied at one or both sides of the sheet assembly 7 during manufacturing.

Figure 4:
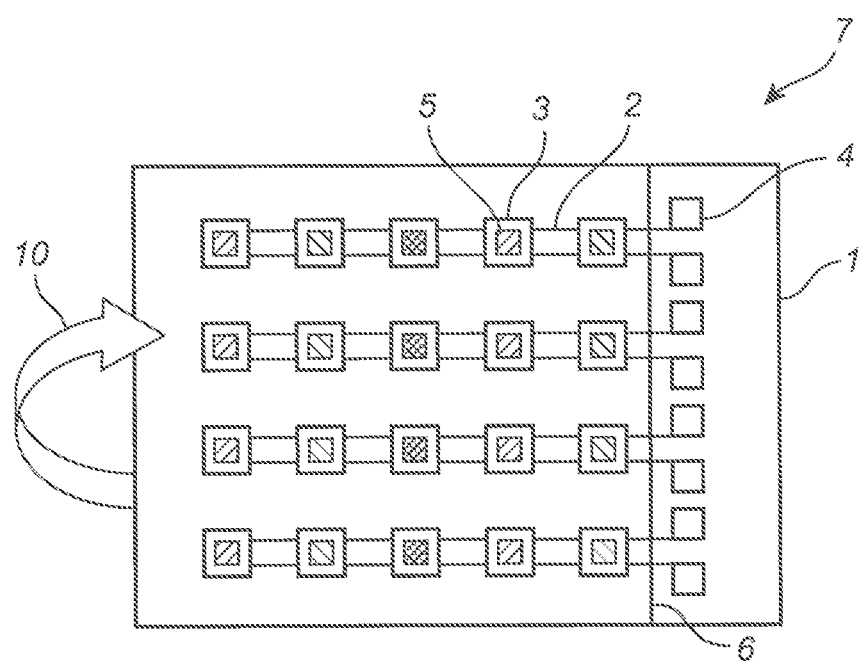
Figure 5:
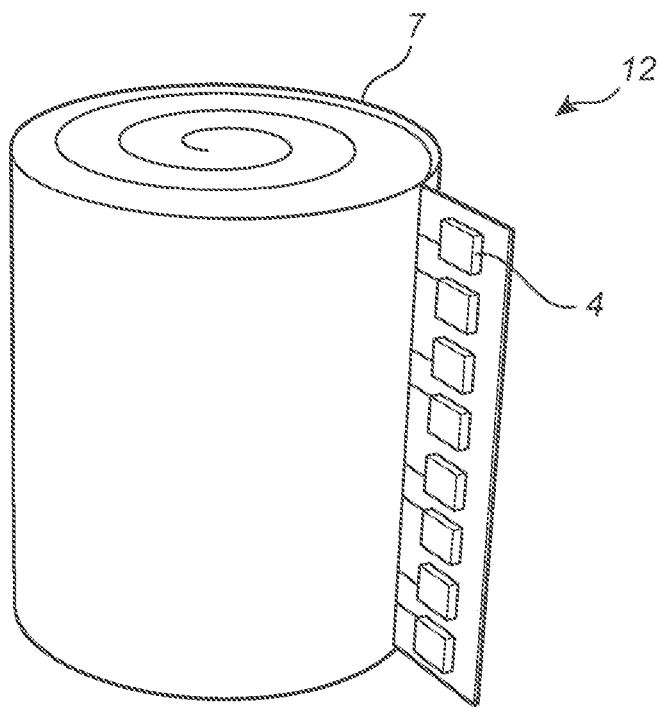

Further, the sheet assembly 7 is rolled, as illustrated by arrow 10 in FIG. 4, so as to form a roll 12, as illustrated in FIG. 5. Thus, the method comprises arranging at least a portion of the sheet assembly 7 in a rolled-up arrangement forming a roll 12. Preferably, the roll 12 may be (substantially) cylinder shaped. A portion of the sheet assembly 7, such as the portion at which the driver contact pads 4 are located, may be left unrolled so as to facilitate access to the driver contact pads 4. The method further comprises fixing the sheet assembly 7 in the rolled-up arrangement. The adhesiveness of the sheet assembly 7 facilitates the rolling process (and thereby the manufacturing process), as the sheet assembly 7 is continuously fixed in the rolled-up arrangement during the rolling process. Thus, fixing the sheet assembly in the rolled-up arrangement may comprise adhering at least a portion of a side of the sheet assembly 7 facing inwards in the roll 12 (i.e. towards the center of the roll 12) to at least a portion of a side of the sheet assembly 7 facing outwards in the roll 12. Further, the fixing may comprise curing at least a portion of the sheet assembly 7 (such as at least a portion of the substrate 1 and/or at least a portion of the coating layer 6), whereby the cured portion of the sheet assembly 7 becomes rigid and the sheet assembly 7 is thereby kept in the rolled-up arrangement. The curing may e.g. comprise thermal and/or UV curing. Optionally, the fixing of the rolled-up arrangement may comprise arranging wrapping means (such as a strap or the like) around the roll 12.

It will be appreciated that merely one, or a combination of several, of the above described fixing methods (adhesive, curing and wrapping means) may be used in the present method for fixing the sheet assembly 7 in the rolled-up arrangement forming the roll 12.

Figure 6:
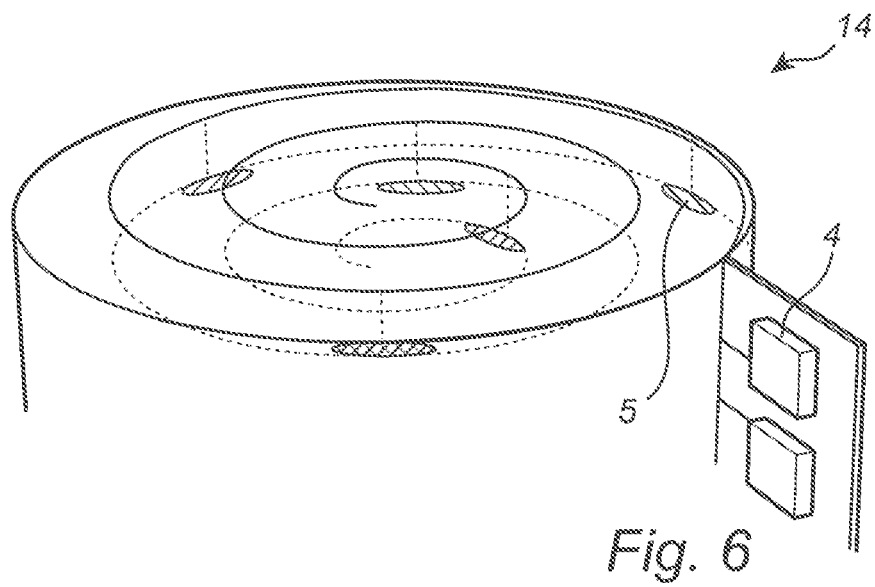

Optionally, the method may further comprise dividing the roll 12 along a direction transverse to the longitudinal direction of the roll 12, into at least two parts. The divided parts may e.g. be formed as disc-shaped rolls. Such a disc-shaped roll 14 is illustrated in FIG. 6. Each disc-shaped roll 14 (or part) may constitute a lighting device. Alternatively, the roll 12 may remain undivided and constitute one lighting device (as illustrated in FIG. 5).

The product of the above described method may be a lighting device 30, as illustrated in FIG. 7. Thus, the lighting device 30 comprises the (undivided) rolled-up arrangement of the sheet assembly forming the roll 12. A cross-section taken perpendicular to the longitudinal (or axial) direction of the lighting device 30 is illustrated in FIG. 8. The thickness of the coating layer 6 and/or the thickness of the substrate 1 may be selected so as to provide a desired spacing between the layers in the roll 12. Such thicknesses may e.g. be selected based on thermal capacity (for improving thermal isolation between the light sources 5) and/or size requirements or desires for the lighting device 30. In the present embodiment, the lighting device is arranged such that light emitted by the light sources 5 is output from an end 31 of the roll 12. Light may be generated by the light sources 5 and guided along the roll 12 towards the end 31 of the roll 12. Optionally, the lighting device 30 may comprise a reflective layer 32 wrapped around the roll 12 for enhancing guiding of light emitted by the light sources 5 towards the end 31 of the roll 12. Further, the sheet assembly 7 may comprise optical particles, such as phosphor particles or white particles for affecting the light output characteristics of the lighting device 30. The particles may e.g. be dispersed in, or at a surface of, the substrate 1 and/or coating layer 6.

According to another embodiment, a disc-like lighting device 40 may be provided by the above described method, as illustrated in FIG. 9. Thus, the disc-like lighting device 40 may comprise the disc-shaped roll 14 formed by the rolled-up arrangement of the sheet assembly. The disc-like lighting device 40 may be similarly configured as the lighting device described with reference to FIG. 9. Light emitted by the light sources 5 may be output from an end 41 of the disc-shaped roll 14.

The lighting devices described above may e.g. be used for high-brightness applications, such as in vehicle headlights. Similar lighting devices may also be used for fluid purification as will be described in more detail in the following.

A fluid purification lighting device 50 according to an embodiment will be described with reference to FIG. 10. A cross-section taken perpendicular to the longitudinal (or axial) direction of the lighting device 50 is illustrated in FIG. 11. The lighting device 50 comprises a roll 51 formed by a rolled-up arrangement of a sheet assembly, which may be similarly configured as the rolled-up arrangement described with reference to FIGS. 1 to 6. In the present embodiment, the light sources 55 may be configured to emit UV light (e.g. including devices such as UV LEDs). Further, at least one channel 56 may extend through the roll 51 for guiding fluid (e.g. air or water) in the lighting device 50. In the present embodiment, the channel 56 is arranged such that fluid guided there through is illuminated by the light sources 55. For example, the channel 56 may be provided by forming a groove in the sheet assembly during manufacturing of the lighting device 50. The groove may e.g. be formed in the coating layer and/or in the substrate of the sheet assembly. The groove may extend across the sheet assembly in a direction along the rolling direction of the sheet assembly, thereby forming a spiral in the roll 51, as shown in the cross-section in FIG. 11. The channel 56 may comprise an inlet 57 for taking in fluid in the lighting device 50 and an outlet 58 for exhausting fluid from the lighting device 50.

In the present embodiment, the lighting device 50 may be used for fluid purification. When the fluid is guided through the channel 56 in the roll 51 of the lighting device 50, the illumination of the fluid by the UV light sources 55 kills or destroys germs (or microorganisms) present in the fluid. For further enhancing the purification process, the lighting device 50 may comprise a catalyst, which may be arranged in the channel 56. As the light source 55 density in the lighting device 50 may be rather high due to the rolled-up arrangement, a rather high lumen output may be provided in the roll 51. In the present embodiment, the light sources 55 may preferably be arranged so as to emit light at least partly inwards in the roll 51. Further, a reflector 52, such as a reflective film (or coating) may be arranged to surround the roll 51 in order to further increase the light intensity in direction inwards in the roll 51. Optionally, the reflector 51 may substantially cover the circumference of the roll 51 and/or the end surfaces of the roll 51 (not shown).

A fluid purification lighting device 60 according to another embodiment will be described with reference to FIG. 12. A cross-section taken perpendicular to the longitudinal (or axial) direction of the lighting device 60 is illustrated in FIG. 13. The lighting device 60 may be similarly configured as the lighting device described with reference to FIGS. 10 and 11, except that a channel 66 for guiding fluid in the lighting device 60 is arranged substantially in the middle of a roll 61 and extends along the longitudinal (or axial) direction of the roll 61. For example, the channel 66 may comprise a light transmissive tube arranged along the innermost edge of the sheet assembly in the roll 61. The channel 66 may comprise an inlet 67 for taking in fluid and an outlet 68 for exhausting fluid. Optionally, a catalyst for enhancing the purification process may be disposed in the channel 66.

Channels for guiding fluid through the lighting device, such as those described for the lighting devices illustrated in FIGS. 10 to 13, may also be used for dissipating heat from the light sources of the lighting device. Thus, such channels may be used not just for fluid purification devices but also for other types of lighting devices, such as vehicle head lights and other high brightness devices. Such channels may comprise projections, such as fins, extending into the channel and being adapted to dissipate heat generated by the light sources. The projections increase the heat dissipation area in the channel, thereby enhancing cooling of the light sources.

While embodiments of the invention have been illustrated and described in detail in the drawings and foregoing description, such illustration and description are to be considered illustrative or exemplary and not restrictive; the invention is not limited to the disclosed embodiments. For example, the coating layer may be omitted in the sheet assembly, wherein the substrate and the light sources form the rolled-up arrangement. Further, the cross-sectional shape of the roll may be essentially circular (as illustrated in the drawings) or have any other desired shape, such as essentially oval (with essentially straight edges). Further, the embodiments described with reference to FIGS. 1 to 9 are all combinable with the embodiments described with reference to FIGS. 10 to 13.

It will be appreciated that the lighting device according to the present invention may be used not just for high brightness applications, but for any appropriate lighting application.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A lighting device comprising a sheet assembly, the sheet assembly comprising:
    a substrate being at least partly light transmissive, and
    a plurality of light sources coupled to the substrate,
    driver contact pads disposed on the substrate for connecting at least one of driving electronics and a power source to the light sources,
    wherein at least a portion of the sheet assembly is fixed in a rolled-up arrangement so as to form a roll comprising a plurality of layers, and the plurality of light sources are arranged on at least more than one layer of the plurality of layers, and wherein a portion of the substrate at which the driver contact pads are located is unrolled.

2. The lighting device as defined in claim 1, wherein the plurality of light sources in said portion of the sheet assembly are arranged to emit light in at least one of the following ways: at least partly inwards in the roll and at least partly towards at least one end of the roll.

3. The lighting device as defined in claim 1, wherein at least a portion of the sheet assembly is rigidly fixed in the rolled-up arrangement.

4. The lighting device as defined in claim 1, wherein the sheet assembly further comprises a coating layer being at least partly light transmissive and arranged to cover the plurality of light sources coupled to the substrate.

5. The lighting device as defined in claim 1, wherein at least a portion of a side of the sheet assembly facing inwards in the roll is adhered to at least a portion of a side of the sheet assembly facing outwards in the roll.

6. The lighting device as defined in claim 1, further comprising a reflector arranged to at least partly surround the roll and to reflect light emitted by the plurality of light sources.

7. The lighting device as defined in claim 1, further comprising at least one channel for fluid, wherein the at least one channel is arranged at least partly within the roll.

8. The lighting device as defined in claim 7, wherein at least one of said at least one channel is arranged such that the fluid in the channel can be illuminated by the plurality of light sources.

9. The lighting device as defined in claim 8, further comprising a catalyst arranged in said channel in which fluid can be illuminated by the plurality of light sources, the catalyst being adapted to enhance purification of fluid illuminated by the plurality of light sources in the channel.

10. The lighting device as defined in claim 7, wherein at least one of said at least one channel is arranged so as to guide fluid in the lighting device for dissipating heat generated by the plurality of light sources.

11. The lighting device as defined in claim 10, wherein the channel comprises projections extending into the channel and being adapted to dissipate heat generated by the plurality of light sources.

12. The lighting device as defined in claim 4, wherein the coating layer is a spacing layer for spacing the substrate and light sources from the overlying substrate in the roll.

13. The lighting device as defined in claim 12, wherein a thickness of the coating layer is determined based on a spacing between the layers in the roll.

\* \* \* \* \*